US009065577B2

(12) United States Patent
Griffin et al.

(10) Patent No.: US 9,065,577 B2
(45) Date of Patent: Jun. 23, 2015

(54) DIGITAL RADIO RECEIVER SYSTEM AND METHOD

(71) Applicant: Frontier Silicon Limited, Sawston, Cambridgeshire (GB)

(72) Inventors: Ivan Griffin, Clonmacken (IE); Daire McNamara, Limerick (IE); Billy O'Mahony, Tulla (IE); David O'Reilly, Sixmilebrige (IE); Darren Bane, Limerick (IE)

(73) Assignee: FRONTIER SILICON LIMITED, Cambridgeshire (GB)

( * ) Notice: Subject to any disclaimer, the term of this patent is extended or adjusted under 35 U.S.C. 154(b) by 0 days.

(21) Appl. No.: 14/273,288

(22) Filed: May 8, 2014

(65) Prior Publication Data

US 2014/0334578 A1 Nov. 13, 2014

(30) Foreign Application Priority Data

May 9, 2013 (GB) .................................. 1308378.7

(51) Int. Cl.
*H03D 1/00* (2006.01)
*H04L 27/06* (2006.01)
(Continued)

(52) U.S. Cl.
CPC ............... *H04H 60/25* (2013.01); *H04H 60/43* (2013.01); *H04H 60/73* (2013.01); *H04H 2201/20* (2013.01); *H04H 40/18* (2013.01); *H04H 60/27* (2013.01)

(58) Field of Classification Search
CPC ............ H04L 27/2647; H04L 27/2332; H04L 2027/003; H04L 27/38; H04L 25/067; H04L 1/0045; H04L 7/042; H04B 1/30
USPC .................................. 375/316, 324, 340, 343
See application file for complete search history.

(56) References Cited

U.S. PATENT DOCUMENTS

| | | | | |
|---|---|---|---|---|
| 8,837,641 | B2 * | 9/2014 | Shirasuka et al. | 375/340 |
| 2001/0028782 | A1 * | 10/2001 | Ohno et al. | 386/46 |

(Continued)

FOREIGN PATENT DOCUMENTS

| | | |
|---|---|---|
| EP | 1067719 | 1/2001 |
| EP | 2149997 | 2/2010 |

(Continued)

OTHER PUBLICATIONS

European Search Report dated Sep. 18, 2014 for European Application No. EP 14 16 7777, in 3 pages.

*Primary Examiner* — Ted Wang
(74) *Attorney, Agent, or Firm* — Knobbe, Martens, Olson & Bear, LLP

(57) ABSTRACT

Provided is a method of scanning for broadcast services in a broadcast signal to generate a broadcast service list for use with a digital radio receiver system, and the digital radio receiver system used for scanning for broadcast services to generate a broadcast service list. The system utilises spectrum awareness data, which includes data defining one or more frequencies at which broadcast services may be receivable, in order to reduce the number of frequencies to scan such that the overall scan time may be reduced. The data in the spectrum awareness data is a filtered subset of the plurality of frequencies at which the broadcast services may be received, which allows the controller of a digital radio receiver to tune a tuner to only the frequencies that are likely to contain a broadcast service when generating or updating a broadcast service list.

66 Claims, 4 Drawing Sheets

(51) Int. Cl.

| | |
|---|---|
| ***H04H 60/25*** | (2008.01) |
| ***H04H 60/43*** | (2008.01) |
| ***H04H 60/73*** | (2008.01) |
| ***H04H 40/18*** | (2008.01) |
| ***H04H 60/27*** | (2008.01) |

(56) References Cited

U.S. PATENT DOCUMENTS

| | | | | |
|---|---|---|---|---|
| 2002/0080895 | A1 | 6/2002 | Lindberg | |
| 2002/0097344 | A1 | 7/2002 | Shibusawa | |
| 2004/0073926 | A1 * | 4/2004 | Nakamura et al. | 725/53 |
| 2007/0268874 | A1 | 11/2007 | Vare et al. | |
| 2011/0109811 | A1 * | 5/2011 | Brandsma et al. | 348/732 |

FOREIGN PATENT DOCUMENTS

| | | | |
|---|---|---|---|
| EP | 2285024 | | 2/2011 |
| GB | 2 345 598 | | 7/2000 |
| JP | 2011 061753 | A | 3/2011 |
| WO | WO 99/14874 | A1 | 3/1999 |
| WO | WO 01/22632 | | 3/2001 |
| WO | WO 01/22632 | A1 | 3/2001 |

* cited by examiner

DIGITAL RADIO RECEIVER SYSTEM AND METHOD

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

1. Field of the Application

The present application relates to a method of scanning for broadcast services in a broadcast signal to generate a broadcast service list for use with a digital radio receiver system, and the digital radio receiver system used for scanning for broadcast services to generate a broadcast service list.

2. Description of the Related Art

When receiving broadcast services, such as OFDM broadcast services (for example DAB broadcast services), it is often desirable for the receiver to discover and collect information about the broadcast services available in the current location. This information is then subsequently available to the user to select a service of choice from a service list menu at a later stage.

Performing this activity in as timely a manner as possible greatly improves perceptions of responsiveness from the perspective of the end user. For example, it may allow the user to browse and select different services more quickly.

A known solution to this is to maintain multiple radio tuners in a radio receiver design, where one of the tuners is used to perform "scanning" for service information. However, a multiple tuner design is costly solution.

We have therefore appreciated the need for a lower-cost solution that may offer improved scanning times using only a single tuner.

SUMMARY

The present invention therefore provides a method of scanning for broadcast services in a broadcast signal to generate a broadcast service list for use with a digital radio receiver system, the broadcast signal comprising a plurality of frames, each frame comprising a plurality of time-interleaved channels, each channel comprising broadcast data associated with one or more broadcast services, the broadcast service list comprising data defining available broadcast services for a digital radio receiver at one or more frequencies, the method comprising the steps of: controlling a tuner of a receiver to tune to a first frequency; receiving a first broadcast signal at the first frequency; demodulating the first received broadcast signal; decoding broadcast data corresponding with a service information channel in a first frame of the first received broadcast signal, the service information channel comprising broadcast service data defining available broadcast services for one or more frequencies; and generating a broadcast service list using the broadcast service data received at the first frequency, wherein the controller selects the first frequency from a plurality of frequencies at which a broadcast signal is receivable based on spectrum awareness data, the spectrum awareness data defining one or more frequencies at which a broadcast signal is receivable by the receiver, and wherein the one or more frequencies of the spectrum awareness data are a filtered subset of the plurality of frequencies.

By utilising spectrum awareness data, which comprises data defining one or more frequencies at which broadcast services may be receivable, this reduces the number of frequencies to scan such that the overall scan time may be reduced. The data in the spectrum awareness data is a filtered subset of the plurality of frequencies at which the broadcast services may be received, which allows the controller of a digital radio receiver to tune a tuner to only the frequencies that are likely to contain a broadcast service when generating or updating a broadcast service list. This greatly improves the broadcast list scan times, since frequencies unlikely to contain broadcast service in the location of the receiver will not be scanned.

The method may further comprise: controlling the tuner of the receiver to tune to a second frequency; receiving a second broadcast signal at the second frequency; demodulating the second received broadcast signal; decoding broadcast data corresponding with a service information channel in a first frame of the second received broadcast signal, the service information channel comprising broadcast service data defining available broadcast services for one or more frequencies; and updating the broadcast service list using the broadcast service data received at the second frequency, wherein the second frequency is different from the first frequency, and wherein the controller selects the second frequency from the plurality of frequencies based on the spectrum awareness data. In this way, a broadcast service list may be generated utilising data from multiple frequencies.

It is noted that the service information channel may comprise at least one channel in each frame. Furthermore, decoding broadcast data comprises decoding one or more channels of broadcast data from one or more frames in the received broadcast signal.

The method may also comprise the step of updating the broadcast service list using broadcast service data received at a different frequency during reception of a broadcast signal at an initial frequency. Such a method may comprise: receiving, demodulating and decoding a service information channel of a first frame in a broadcast signal at an initial frequency; controlling the tuner to tune away from the initial frequency at which the broadcast signal is being received to a different frequency, the different frequency being one of the other frequencies in the spectrum awareness data; receiving and demodulating a broadcast signal at the different frequency; decoding a service information channel in a first frame of the received broadcast signal at the different frequency, the service information channel comprising broadcast service data defining available broadcast services for one or more frequencies; updating the broadcast service list using the broadcast service data received at the different frequency; and controlling the tuner to tune back to the initial frequency and receiving, demodulating and decoding a service information channel from a second received frame in the broadcast signal at the initial frequency.

Advantageously, this method increases the speed at which a broadcast service list may be constructed, since the method is using periods during a received frame that contain unwanted channels to tune away from the initial frequency to detect broadcast service data at the different frequency. Tuning back to the initial frequency in time to receive the second frame ensures that the broadcast service data from the second frame is also captured. The first and second received frames may be consecutive frames in the received broadcast signal.

The method may also comprise the step of updating the spectrum awareness data during reception of a broadcast signal. Such a method may comprise: receiving, demodulating and decoding a first frame in a broadcast signal at an initial frequency; controlling the tuner to tune away from the initial frequency at which the broadcast signal is being received to a different frequency, the different frequency being one of the other frequencies from the plurality of frequencies; detecting a broadcast signal at the different frequency; storing data corresponding with the detected broadcast signal at the different frequency to update the spectrum awareness data; and controlling the tuner to tune back to the initial frequency and receiving, demodulating and decoding a second frame of a broadcast signal at the initial frequency.

Advantageously, this method increases the speed at which the spectrum awareness may be updated, since the method is using periods during a received frame that contain unwanted channels to tune away from the initial frequency to detect the presence of broadcast signals. Tuning back to the initial frequency in time to receive the second frame ensures that the broadcast service data from the second frame is also captured. The first and second received frames may be consecutive frames in the received broadcast signal.

The data being stored in the spectrum awareness data may comprise at least data corresponding to a frequency at which a broadcast signal is detected. The data being stored may also comprise a priority value associated with a detected broadcast signal. In such situations, the method may comprise assigning a higher priority value to a detected broadcast signal not already stored in the spectrum awareness data than a broadcast signal already stored in the spectrum awareness data. The method may also comprise incrementally reducing the priority value associated with a detected broadcast signal after the respective data for the detected broadcast signal has been in the spectrum awareness data for a first period of time.

Where a priority value is stored, the method may comprise removing data associated with a detected broadcast signal from the spectrum awareness data when the priority value for the respective detected broadcast signal falls below a threshold priority value.

Detecting a broadcast signal at the different frequency may comprise determining the presence of a broadcast signal at the different frequency.

In a first aspect, determining the presence of a broadcast signal may comprise detecting a signal having a plurality of frames with substantially the same frame structure as a broadcast signal. In such a method, the broadcast signal comprises a plurality of symbols, each symbol comprising a guard frame comprising a cyclic prefix, and a data portion, and the step of determining the presence of a broadcast signal may comprise the steps of: receiving a plurality of samples at the respective frequency, the number of samples corresponding with the length of at least two symbols; performing a sliding correlation on the received plurality of samples to identify a peak of correlation between the samples, the sliding correlation occurring a number of samples apart corresponding with a number of samples in the data portion of a symbol; correcting a phase of the received samples using the identified peak in correlation to generate a phase corrected signal; performing a first correlation comprising correlating a plurality of samples from a first region of the phase corrected signal with a plurality of samples in a second region of the phase corrected signal; performing a second correlation comprising correlating a plurality of samples from a third region of the phase corrected signal with a plurality of samples in a fourth region of the phase corrected signal; detecting a broadcast signal in the plurality of samples from the broadcast receiver based on the first and second correlations.

Advantageously, the symbol structure enables metrics of various portions to be calculated to give an indication of the likelihood of the received samples comprising a suitable broadcast signal.

In a second aspect, determining the presence of a broadcast signal comprises determining the presence of a signal power indicating the presence of a broadcast signal at the respective frequency.

Detecting a broadcast signal at the different frequency may comprise determining a quality metric of the broadcast signal at the different frequency, such as the Signal to Noise Ratio.

The above methods may also comprise the step of generating the spectrum awareness data prior to controlling a tuner of a receiver to tune to a first frequency. In such a method, generating the spectrum awareness data may comprise: controlling the tuner to tune to each of the plurality of frequencies in turn; at each of the plurality of frequencies, detecting a broadcast signal at the respective frequency; and storing data corresponding with the detected broadcast signal at the respective frequency to generate the spectrum awareness data.

The data being stored may comprise at least data corresponding to a frequency at which a broadcast signal is detected. The data being stored may also comprise a priority value associated with a detected broadcast signal. In such a situation, the method may comprise assigning a higher priority value to a detected broadcast signal not already stored in the spectrum awareness data than a broadcast signal already stored in the spectrum awareness data.

When a priority value is stored, the method may comprise incrementally reducing the priority value associated with a detected broadcast signal after the respective data for the detected broadcast signal has been in the spectrum awareness data for a first period of time. Furthermore, the method may comprise removing data associated with a detected broadcast signal from the spectrum awareness data when the priority value for the respective detected broadcast signal falls below a threshold priority value.

Detecting a broadcast signal at the respective frequency may comprise determining the presence of a broadcast signal at the respective frequency.

In a first aspect, determining the presence of a broadcast signal may comprise detecting a signal having a plurality of frames with substantially the same frame structure as a broadcast signal.

In such a method, the broadcast signal comprises a plurality of symbols, each symbol comprising a guard frame comprising a cyclic prefix, and a data portion, the step of determining the presence of a broadcast signal may comprise the steps of: receiving a plurality of samples at the respective frequency, the number of samples corresponding with the length of at least two symbols; performing a sliding correlation on the received plurality of samples to identify a peak of correlation between the samples, the sliding correlation occurring a number of samples apart corresponding with a number of samples in the data portion of a symbol; correcting a phase of the received samples using the identified peak in correlation to generate a phase corrected signal; performing a first correlation comprising correlating a plurality of samples from a first region of the phase corrected signal with a plurality of samples in a second region of the phase corrected signal; performing a second correlation comprising correlating a plurality of samples from a third region of the phase corrected signal with a plurality of samples in a fourth region of the phase corrected signal; detecting a broadcast signal in the plurality of samples from the broadcast receiver based on the first and second correlations.

Advantageously, the symbol structure enables metrics of various portions to be calculated to give an indication of the likelihood of the received samples comprising a suitable broadcast signal.

In a second aspect, determining the presence of a broadcast signal may comprise determining the presence of a signal power indicating the presence of a broadcast signal at the respective frequency.

Detecting a broadcast signal at the respective frequency may also comprise determining a quality metric of the broadcast signal, for example a Signal to Noise Ratio.

In the above methods, the tuner may be controlled to tune to each of the plurality of frequencies one or more times during generation of the spectrum awareness data.

Furthermore, the step of generating the spectrum awareness data may be performed after the controller has decoded broadcast data corresponding with a service information channel in a first frame of a received broadcast signal at a frequency corresponding with a last frequency in the spectrum awareness data.

The present invention also provides a digital radio receiver system for scanning for broadcast services in a broadcast signal to generate a broadcast service list for use in controlling the digital radio receiver system, the broadcast signal comprising a plurality of frames, each frame comprising a plurality of time-interleaved channels, each channel comprising broadcast data associated with one or more broadcast services, the broadcast service list comprising data defining available broadcast services for a digital radio receiver at one or more frequencies, the receiver system comprising: a tuner coupleable to an antenna for receiving broadcast signals; a demodulator coupled to an output of the tuner for demodulating a received broadcast signal into a plurality of received frames; a decoder coupled to an output of the demodulator for decoding the received plurality of frames; and a controller coupled to the tuner and demodulator, wherein the controller is configured to: control the tuner to tune to a first frequency; receive a first broadcast signal at the first frequency; demodulate the first received broadcast signal; decode broadcast data corresponding with a service information channel in a first frame of the first received broadcast signal, the service information channel comprising broadcast service data defining available broadcast services for one or more frequencies; and generate a broadcast service list using the broadcast service data received at the first frequency, wherein the controller is configured to select the first frequency from a plurality of frequencies at which a broadcast signal is receivable based on spectrum awareness data, the spectrum awareness data defining one or more frequencies at which a broadcast signal is receivable by the receiver, and wherein the one or more frequencies of the spectrum awareness data are a filtered subset of the plurality of frequencies.

By utilising spectrum awareness data, which comprises data defining one or more frequencies at which broadcast services may be receivable, this reduces the number of frequencies to scan such that the overall scan time may be reduced. The data in the spectrum awareness data is a filtered subset of the plurality of frequencies at which the broadcast services may be received, which allows the controller of a digital radio receiver to tune a tuner to only the frequencies that are likely to contain a broadcast service when generating or updating a broadcast service list. This greatly improves the broadcast list scan times, since frequencies unlikely to contain broadcast service in the location of the receiver will not be scanned.

In the receiver system, the controller may be configured to: control the tuner to tune to a second frequency; receive a second broadcast signal at the second frequency; demodulate the second received broadcast signal; decode broadcast data corresponding with a service information channel in a first frame of the second received broadcast signal, the service information channel comprising broadcast service data defining available broadcast services for one or more frequencies; and update the broadcast service list using the broadcast service data received at the second frequency, wherein the second frequency is different from the first frequency, and wherein the controller selects the second frequency from the plurality of frequencies based on the spectrum awareness data. In this way, a broadcast service list may be generated utilising data from multiple frequencies.

It is noted that the service information channel may comprise at least one channel in each frame. Furthermore, decoding broadcast data may comprise decoding one or more channels of broadcast data from one or more frames in the received broadcast signal.

The receiver system controller may be configured to update the broadcast service list using broadcast service data received at a different frequency during reception of a broadcast signal at an initial frequency.

In such a receiver, the controller may be configured to: receive, demodulate and decode a service information channel of a first frame in a broadcast signal at an initial frequency; control the tuner to tune away from the initial frequency at which the broadcast signal is being received to a different frequency, the different frequency being one of the other frequencies in the spectrum awareness data; receive and demodulate a broadcast signal at the different frequency; decode a service information channel in a first frame of the received broadcast signal at the different frequency, the service information channel comprising broadcast service data defining available broadcast services for one or more frequencies; update the broadcast service list using the broadcast service data received at the different frequency; and control the tuner to tune back to the initial frequency and receive, demodulate and decode a service information channel from a second received frame in the broadcast signal at the initial frequency.

Advantageously, this increases the speed at which a broadcast service list may be constructed, since the controller is using periods during a received frame that contain unwanted channels to tune away from the initial frequency to detect broadcast service data at the different frequency. Tuning back to the initial frequency in time to receive the second frame ensures that the broadcast service data from the second frame is also captured. The first and second received frames may be consecutive frames in the received broadcast signal.

The controller may also be configured to update the spectrum awareness data during reception of a broadcast signal. In such a receiver, the controller may configured to: receive, demodulate and decode a first frame in a broadcast signal at an initial frequency; control the tuner to tune away from the initial frequency at which the broadcast signal is being received to a different frequency, the different frequency being one of the other frequencies from the plurality of frequencies; detect a broadcast signal at the different frequency; store data corresponding with the detected broadcast signal at the different frequency to update the spectrum awareness data; and control the tuner to tune back to the initial frequency to receive, demodulate and decode a second frame of a broadcast signal at the initial frequency.

Advantageously, this increases the speed at which the spectrum awareness may be updated, since the controller is using periods during a received frame that contain unwanted channels to tune away from the initial frequency to detect the presence of broadcast signals. Tuning back to the initial frequency in time to receive the second frame ensures that the broadcast service data from the second frame is also captured. The first and second received frames may be consecutive frames in the received broadcast signal.

The data being stored in the spectrum awareness data may comprise at least data corresponding to a frequency at which a broadcast signal is detected. The data being stored may also comprise a priority value associated with a detected broadcast signal, and the controller is configured to assigning a higher priority value to a detected broadcast signal not already stored in the spectrum awareness data than a broadcast signal already stored in the spectrum awareness data.

Where the data being stored comprises a priority value, the controller may be configured to incrementally reducing the priority value associated with a detected broadcast signal after the respective data for the detected broadcast signal has been in the spectrum awareness data for a first period of time. The controller may also be configured to remove data associated with a detected broadcast signal from the spectrum awareness data when the priority value for the respective detected broadcast signal falls below a threshold priority value.

The controller may be configured to detect a broadcast signal at the different frequency by determining the presence of a broadcast signal at the different frequency.

In a first aspect, determining the presence of a broadcast signal comprises detecting a signal having a plurality of frames with substantially the same frame structure as a broadcast signal.

In the first aspect, the broadcast signal comprises a plurality of symbols, each symbol comprising a guard frame comprising a cyclic prefix, and a data portion, and the controller may be configured to determine the presence of a broadcast signal by: receiving a plurality of samples at the respective frequency, the number of samples corresponding with the length of at least two symbols; performing a sliding correlation on the received plurality of samples to identify a peak of correlation between the samples, the sliding correlation occurring a number of samples apart corresponding with a number of samples in the data portion of a symbol; correcting a phase of the received samples using the identified peak in correlation to generate a phase corrected signal; performing a first correlation comprising correlating a plurality of samples from a first region of the phase corrected signal with a plurality of samples in a second region of the phase corrected signal; performing a second correlation comprising correlating a plurality of samples from a third region of the phase corrected signal with a plurality of samples in a fourth region of the phase corrected signal; detecting a broadcast signal in the plurality of samples from the broadcast receiver based on the first and second correlations.

Advantageously, the symbol structure enables metrics of various portions to be calculated to give an indication of the likelihood of the received samples comprising a suitable broadcast signal.

In a second aspect, determining the presence of a broadcast signal comprises determining the presence of a signal power indicating the presence of a broadcast signal at the respective frequency.

Furthermore, detecting a broadcast signal at the different frequency may comprise determining a quality metric of the broadcast signal at the different frequency, for example a Signal to Noise Ratio.

The controller may be configured to generate the spectrum awareness data prior to controlling the tuner to tune to a first frequency.

The controller may also be configured to generate the spectrum awareness data by: controlling the tuner to tune to each of the plurality of frequencies in turn; at each of the plurality of frequencies, detecting a broadcast signal at the respective frequency; and storing data corresponding with the detected broadcast signal at the respective frequency to generate the spectrum awareness data.

The data being stored in the spectrum awareness data may comprise at least data corresponding to a frequency at which a broadcast signal is detected. Furthermore, the data being stored may comprise a priority value associated with a detected broadcast signal, and the controller may be configured to assign a higher priority value to a detected broadcast signal not already stored in the spectrum awareness data than a broadcast signal already stored in the spectrum awareness data.

When a priority value is stored, the controller may be configured to incrementally reduce the priority value associated with a detected broadcast signal after the respective data for the detected broadcast signal has been in the spectrum awareness data for a first period of time. Furthermore, the controller may be configured to remove data associated with a detected broadcast signal from the spectrum awareness data when the priority value for the respective detected broadcast signal falls below a threshold priority value.

Detecting a broadcast signal at the respective frequency may comprise the controller determining the presence of a broadcast signal at the respective frequency.

In a first aspect, determining the presence of a broadcast signal comprises detecting a signal having a plurality of frames with substantially the same frame structure as a broadcast signal. In such an aspect, the broadcast signal comprises a plurality of symbols, each symbol comprising a guard frame comprising a cyclic prefix, and a data portion, the controller may be configured to determine the presence of a broadcast signal by: receiving a plurality of samples at the respective frequency, the number of samples corresponding with the length of at least two symbols; performing a sliding correlation on the received plurality of samples to identify a peak of correlation between the samples, the sliding correlation occurring a number of samples apart corresponding with a number of samples in the data portion of a symbol; correcting a phase of the received samples using the identified peak in correlation to generate a phase corrected signal; performing a first correlation comprising correlating a plurality of samples from a first region of the phase corrected signal with a plurality of samples in a second region of the phase corrected signal; performing a second correlation comprising correlating a plurality of samples from a third region of the phase corrected signal with a plurality of samples in a fourth region of the phase corrected signal; detecting a broadcast signal in the plurality of samples from the broadcast receiver based on the first and second correlations.

Advantageously, the symbol structure enables metrics of various portions to be calculated to give an indication of the likelihood of the received samples comprising a suitable broadcast signal.

In a second aspect, the controller determines the presence of a broadcast signal by determining the presence of a signal power indicating the presence of a broadcast signal at the respective frequency.

When detecting a broadcast signal at the respective frequency, the controller may also determining a quality metric of the broadcast signal, for example a Signal to Noise Ratio.

The controller may be configured to control the tuner to tune to each of the plurality of frequencies one or more times during generation of the spectrum awareness data.

Furthermore, the controller may be configured to generate the spectrum awareness data after the controller has decoded a channel of broadcast data corresponding with a service information channel in a first frame of a received broadcast signal at a frequency corresponding with a last frequency in the spectrum awareness data.

In any of the above described methods and systems, the received broadcast signal may be a DAB signal, and the service information channel may be a Fast Information Channel in the received DAB signal.

BRIEF DESCRIPTION OF THE DRAWINGS

The invention will be described, by way of example only with reference to the accompanying figures, in which.

DETAILED DESCRIPTION

In brief, the invention utilises spectrum awareness data, which comprises data defining one or more frequencies at which broadcast services may be receivable, in order to reduce the number of frequencies to scan such that the overall scan time may be reduced. The data in the spectrum awareness data is a filtered subset of the plurality of frequencies at which the broadcast services may be received, which allows the controller of a digital radio receiver to tune a tuner to only the frequencies that are likely to contain a broadcast service when generating or updating a broadcast service list. This greatly improves the broadcast list scan times, since frequencies unlikely to contain broadcast service in the location of the receiver will not be scanned.

As an example, in the DAB system there are a number of frequencies at which DAB ensembles may be received (for example, 14 frequencies are currently reserved for Band III use in the UK). However, not all frequencies are utilised at every location. Regional variations of the frequencies used for transmission of broadcast services mean that several of the frequencies are not utilised for transmission of broadcast services at a location. As such, a digital radio receiver configured to scan each of the frequencies will take a relatively longer time to complete a scan of the broadcast services across the several frequencies than one of the present invention, since the digital radio receiver of the present invention will only scan the frequencies most likely to contain broadcast services based on the spectrum awareness data.

As described above, for cost reasons it is preferable only to use one tuner. As such, the present invention provides an apparatus and method of accelerating the reception of services information from broadcast services (such as OFDM services such as DAB) with a single RF tuner frontend/single demodulator.

Figure 1:
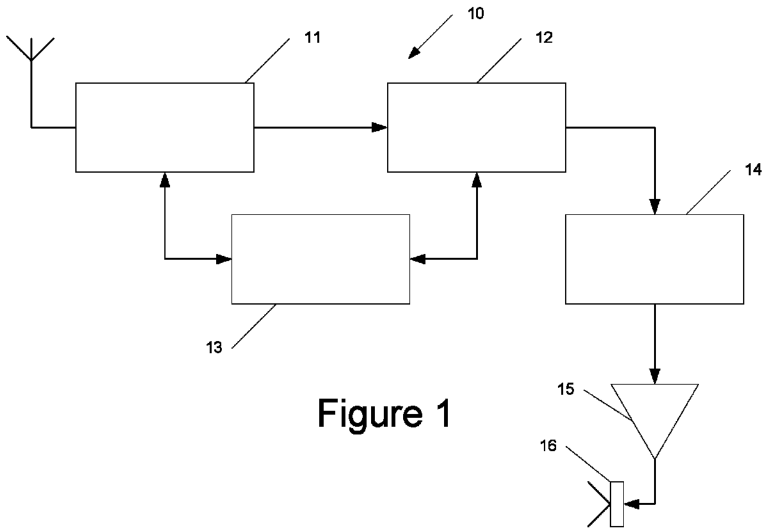
FIG. 1 shows a simplified system diagram for a digital radio receiver system.

FIG. 1 shows a simplified system diagram for a digital radio receiver system 10 according to the present invention. A tuner 11 receives broadcast signals from an antenna and passes the signals to a demodulator 12 and decoder 14. A controller 13 is coupled to the tuner 11 and demodulator 12 and can control the tuning frequency of the tuner 11. If the demodulated and decoded signal comprises an audio component, the audio component is passed to a power amplifier 15 and a loudspeaker 16.

During normal use, the user selects a broadcast service listed as available in a broadcast service list (for example, the radio station identifier is presented to the user). The controller 13 tunes the tuner 11 to the appropriate frequency associated with the selected broadcast service from the broadcast service list. For audio components, the power amplifier and loudspeaker device will deliver the broadcast service to the user.

Figure 2:
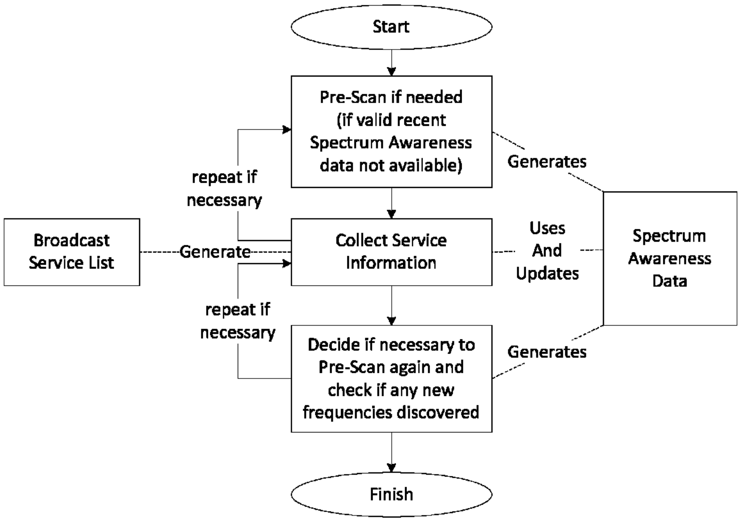
FIG. 2 shows an overall flow chart for generating the broadcast service list using pre-scan and foreground scanning.
Figure 3:
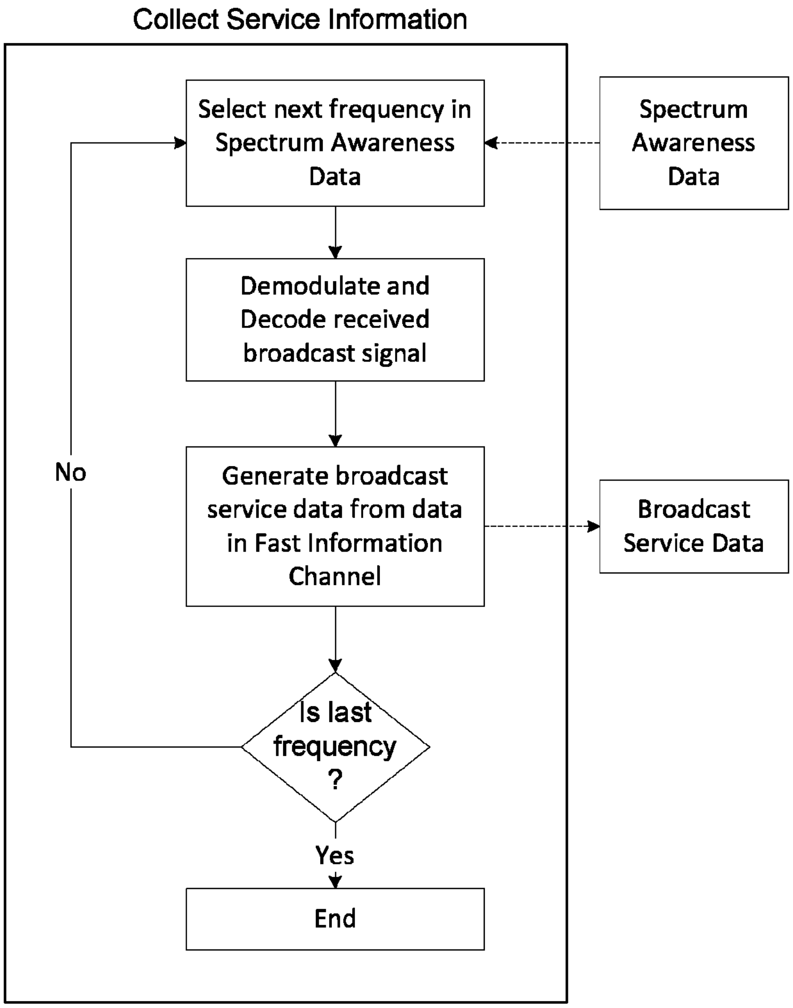
FIG. 3 shows a more detailed flow chart for generating the broadcast service list during foreground scanning.

Referring to FIGS. 2 and 3, which illustrate generation of the broadcast service list, the user, prior to normal use, may select to detect the broadcast services currently available ("scanning") in that location. During scanning, the controller controls the tuner to tune to each frequency within the current frequency band, and the demodulator and decoder parse the broadcast service information and collect it in the broadcast service list for later presentation to the user. In the present invention, the controller selects the frequency in the current frequency band based on the frequencies listed in the spectrum awareness data (its generation will be discussed in more detail below).

In a DAB system, the broadcast service information may be found in the Fast Information Channel (FIC) of the DAB frame. The receiver system may decode one or more FICs from a plurality of frames within the received broadcast signal in order to generate the broadcast service list from the broadcast service data within the FICs.

As mentioned above, the spectrum awareness data is a filtered subset of the plurality of frequencies available for reception of a broadcast digital radio signal. The generation and updating of the spectrum awareness data will be discussed below.

When the user/host decides to scan, the controller makes a decision about whether to add a pre-scan stage to the scanning activity. This pre-scan stage is a period of confidence information collection, and is employed if the controller decides that it has insufficient spectrum awareness about relevant frequencies to check for signals that contain broadcast service information (for example OFDM signals in DAB broadcast systems). The spectrum awareness data generated by the pre-scan stage is subsequently used by the controller to reduce the number of frequencies necessary to tune to in order to determine all the available service information.

Figure 4:
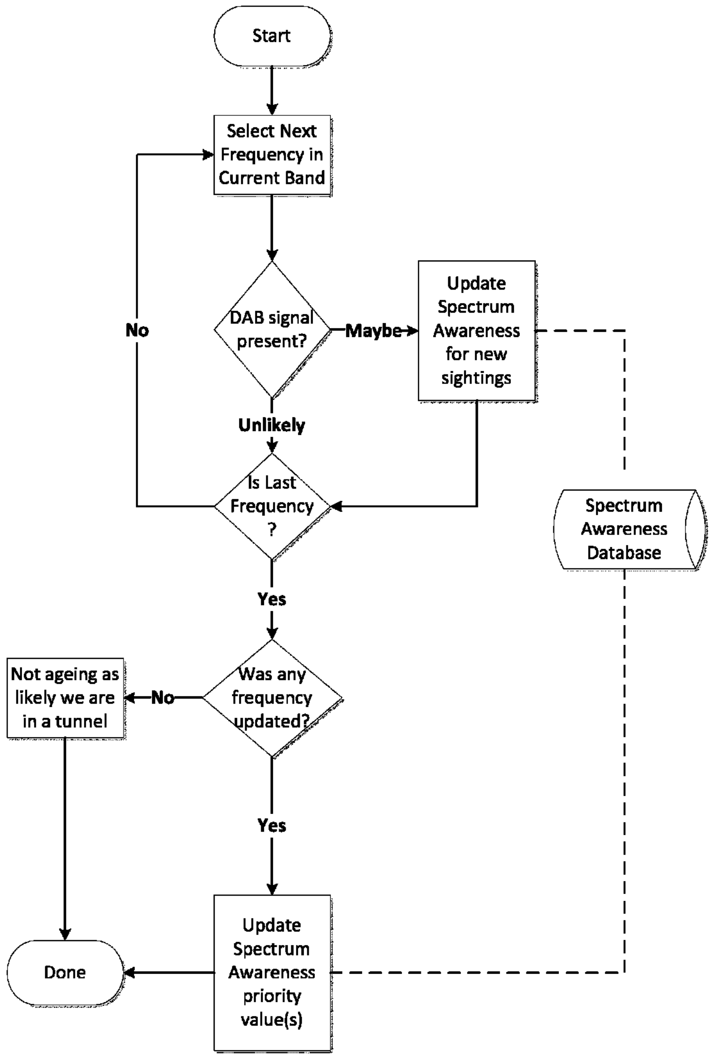
FIG. 4 shows a flow chart for generating the spectrum awareness data.

We will now discuss the generation and updating of the spectrum awareness data with reference to FIG. 4.

The controller is periodically looking to collect information about the probability/confidence of OFDM broadcast signals being present on various frequencies ("spectrum awareness").

During a pre-scan stage, each frequency within the current band is visited one or more times to refine the confidence estimation. For each frequency visited (by the controller tuning the tuner to that frequency), the controller determines whether or not a broadcast signal is present at that frequency. For each instance of a broadcast signal being present, data associated with that frequency is stored in the spectrum awareness data. The data comprises at least an indication of the frequency so that the controller can use this data when it is required to scan for broadcast service data. The controller controls the tuner to the next frequency and the process repeats until the last frequency is reached.

After the last frequency, the controller may repeat the spectrum awareness pre-scan again, or may exit the pre-scan process to search for broadcast service data to generate the broadcast service list.

As well as data associated with the frequency at which a broadcast signal is detected, the controller stores a priority value or weighted metric associated with that particular data. For each new frequency not already in the spectrum awareness data, a higher weighting or priority value is assigned than one of an entry already present in the spectrum awareness data. Those already in the spectrum awareness data are aged over a period of time (i.e. the priority value is decreased after a period of time). Those entries having a priority value below a threshold value are removed from the spectrum awareness data.

As well as weighting, each incremental instantaneous estimation is weighted and averaged together to smooth other any transient changes in apparent signal availability ("smoothing").

The confidence estimation smoothing used during this pre-scan stage ensures that the reduction of the number of frequencies necessary to tune to in order to determine all available service information is not overly aggressive, and thus unintentionally missing potential broadcast signals. New frequencies are added with a strong weighting (i.e. higher priority value) into the list of potential candidates, and decay slowly out of the list. This works on the philosophy of speed versus accuracy, but with a strong bias towards any mistakes being false positives (i.e. an unnecessary frequency to be checked) rather than any false negatives (which would potentially result in the scan not detecting an ensemble).

The confidence estimation smoothing algorithm used during this pre-scan stage is specifically chosen to gather information quickly from a position of limited spectrum awareness.

When the spectrum awareness data is updated (rather than generated), the smoothing techniques employed differ to those in the generation process. The smoothing techniques utilised in the updating of the spectrum awareness data use a weaker weighting (priority value), allowing the system to trade off speed for accuracy.

There are various techniques that may be used to determine whether or not a broadcast signal (for example an OFDM DAB signal) is present at a particular frequency for storing in the spectrum awareness data.

A first technique, based on our previous application GB 1206363.2, utilises the structure of an OFDM symbol to quickly determine how likely a received signal is to be an OFDM signal, and how likely it is not to be an OFDM signal. During a scanning operation these metrics allow a receiver to make a quick assessment on whether to store the data in the spectrum awareness data or to skip over a frequency.

In essence, the method does not assume the signal is an OFDM signal, but checks how likely or how unlikely that a signal has the correct OFDM structure. The concept is to utilise the property of the OFDM symbol in that it contains highly correlated and highly uncorrelated portions. In an OFDM symbol the guard interval and the tail end of the symbol will correlate with each other. The rest of the symbol can be considered to be white noise and thus does not correlate.

Figure 5:
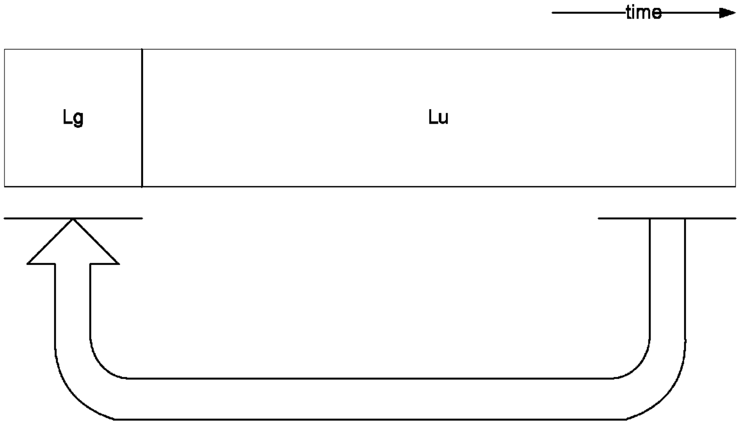
FIG. 5 shows the basic structure of an OFDM symbol.

FIG. 5 shows the basic structure of a broadcast OFDM symbol. The symbol comprises a guard interval or region, which is Lg samples long, and a data region, which is Lu samples long. In OFDM transmission, the guard interval is copy of the latter part of the data region. The guard interval is also known as a cyclic prefix, and advantageously enables receivers to overcome problems associated with received interference.

In this method, the determination of the likelihood of the received signal being an OFDM signal may be made using as few as two symbols' worth of samples, which may be captured without any time/frequency or equalisation processing.

In a second method of determining the presence of a broadcast signal, the controller monitors the received power at the desired frequency. If the received signal strength is greater than the expected noise power and/or greater than a threshold, it is assumed that there may be a broadcast signal at that frequency, and the data is stored in the spectrum awareness data. If it is later found that there is no broadcast data at this frequency, the data is removed from the spectrum awareness data.

Whilst we have described the generation of the spectrum awareness data as a separate step prior to scanning for broadcast service data, the present invention also enables the spectrum awareness data to be generated and updated during receiving and processing of broadcast service data.

In brief, the invention provides a receiver having a single tuner that can be tuned away from a first frequency, from which a first broadcast signal is being received, to a second frequency to detect alternative broadcast signals and tuned back to the first frequency to continue receiving the first broadcast signal without an interruption to the received broadcast data collection. This invention utilises the fact that not all broadcast data within a received frame are required to be decoded in order to receive a desired broadcast service. As such, the tuner can be tuned away, detect alternative services and tuned back to the original frequency to continue receiving the first broadcast service without any perceivable break in the reception of the first broadcast service.

Figure 6:
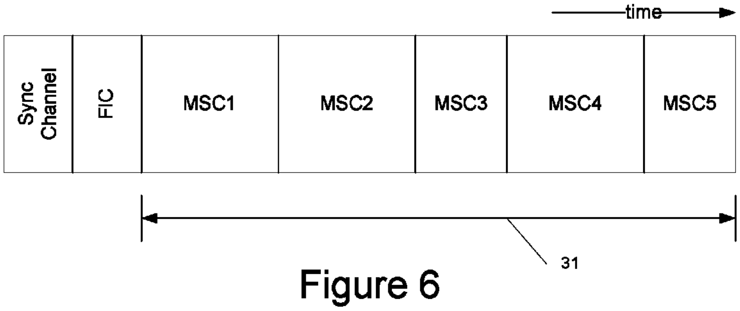
FIG. 6 shows the frame structure of a DAB signal.

FIG. 6 shows the DAB frame structure. It shows a Synchronisation Channel (which comprises NULL and Phase Reference Symbols), which the receiver needs to lock to the DAB signal, a Fast Information Channel (FIC) and a number of MSCs (Main Service Channels) 31 in the main frame. The FIC channel comprises the desired broadcast service data used in generating the broadcast service list. In DAB, the FIC is three symbols long.

Only the Synchronisation and Fast Information Channels are required to generate the broadcast service list, so the tuner may actually tune away from the current frequency to a different frequency during the remaining period of the current frame in order to generate or update the spectrum awareness data as described above. The tuner may than be tuned back to the initial frequency in order to receive the Synchronisation and Fast Information Channels from the subsequent frame (which may be the next frame, or a later frame).

Figure 7:
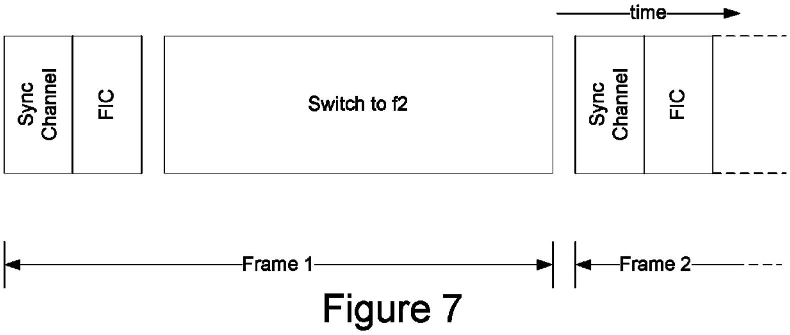
FIG. 7 shows a frame structure of a DAB signal as seen by the receiver of FIG. 1.

FIG. 7 shows a DAB frame structure as seen by the receiver system using this method.

Since the other MSCs (MSC 1 to 5) are not required, the controller switches the tuner to another frequency (in this example, f2) in the time when data relating to MSC 1 to 5 are being broadcast. The controller then switches the tuner back to f1 in time to receive the Synchronisation and Fast Information Channels in the next frame. As such, the controller may continue to receive broadcast service data relating to the current frequency of interest.

During the period when the tuner is switched to the second frequency, the controller uses this period to generate or update the spectrum awareness data as described above.

Alternatively, the controller may use this time to receive broadcast service data from the second frequency to update the broadcast service data associated with the second frequency, thus increasing the speed at which the data is captured to generate the broadcast service list.

In this example, the controller tunes the tuner to one frequency in the same frame. In some embodiments, the controller may tune to more than one different frequency within the same frame, given there is sufficient time to do so within the same frame.

The controller may decide to interleave the pre-scanning stage with broadcast service information collection in order to continue refining its estimation of relevant frequencies (spectrum awareness), based on how many new ensembles have been discovered.

Once the controller has finished checking frequencies indicated by the pre-scan stage, the controller will decide whether to apply additional stages of pre-scan confidence estimation evaluation with a view to discovering frequencies which now appear to contain OFDM broadcast signals that were not evident at the end of the pre-scan stage. If it discovers any, it will tune to those frequencies individually and collect the service information signalled on them. This adds a degree of robustness to performance in ensuring that the service information collection can start early with a reasonable estimation of the presence of signals or not, and refine this as the collection activities progress, finishing with a final stage of further confidence estimation to prevent any signals not being found by the initial quick pre-scan pass.

Through the use of refined spectrum awareness and appropriate smoothing strategies to reduce the number of frequencies to search for OFDM broadcast service information, the present invention can significantly reduce the amount of time required to capture such information into a broadcast service list for subsequent use.

Whilst we have described the method and receiver system comprising a receiver having only one tuner, the method and receiver system may utilise a second tuner. In such an embodiment, the second tuner may be used for the generation and updating of the spectrum awareness data, using the same methods as described above. Alternatively, the second tuner could be used to generate the spectrum awareness data through brute-force scanning (i.e. tuning to each of the frequencies and trying to receive, demodulate and decode whatever signal is there), although this is a less preferable solution since the second tuner would take longer to generate and update the spectrum awareness data than the preferred above-described methods.

Similarly, the second tuner may also be used to find or tune to receive broadcast services in order to populate the broadcast service list, thereby reducing the time taken to present the broadcast service list to the user. In such an embodiment, the spectrum awareness data may be generated and updated as described above during the periods of unwanted data in the received frames of the broadcast service being received.

A single tuner system is preferable due to cost considerations. However, it can be seen that there may be advantages (in particular the speed at which data is gathered and/or the speed at which the broadcast service list is generated and presented to the user) in using a multi-tuner receiver system when combined with the methods as described above.

Although the present invention has been described hereinabove with reference to specific embodiments, the present invention is not limited to the specific embodiments and modifications will be apparent to a skilled person in the art which lie within the scope of the present invention. Any of the embodiments described hereinabove can be used in any combination.

What is claimed is:

1. A method of scanning for broadcast services in a broadcast signal to generate a broadcast service list for use with a digital radio receiver system, the broadcast signal comprising a plurality of frames, each frame comprising a plurality of time-interleaved channels, each channel comprising broadcast data associated with one or more broadcast services, the broadcast service list comprising data defining available broadcast services for a digital radio receiver at one or more frequencies, the method comprising the steps of:

controlling a tuner of a receiver to tune to a first frequency;

receiving a first broadcast signal at the first frequency;

demodulating the first received broadcast signal;

decoding a broadcast data corresponding with a service information channel in a first frame of the first received broadcast signal, the service information channel comprising broadcast service data defining available broadcast services for one or more frequencies; and generating a broadcast service list using the broadcast service data received at the first frequency, wherein the controller selects the first frequency from a plurality of frequencies at which a broadcast signal is receivable based on spectrum awareness data, the spectrum awareness data defining one or more frequencies at which a broadcast signal is receivable by the receiver, and wherein the one or more frequencies of the spectrum awareness data are a filtered subset of the plurality of frequencies.

2. A method according to claim 1, further comprising:

controlling the tuner of the receiver to tune to a second frequency;

receiving a second broadcast signal at the second frequency;

demodulating the second received broadcast signal;

decoding broadcast data corresponding with a service information channel in a first frame of the second received broadcast signal, the service information channel comprising broadcast service data defining available broadcast services for one or more frequencies; and updating the broadcast service list using the broadcast service data received at the second frequency, wherein the second frequency is different from the first frequency, and wherein the controller selects the second frequency from the plurality of frequencies based on the spectrum awareness data.

3. A method according to claim 1, wherein the service information channel comprises at least one channel in each frame.

4. A method according to claim 1, wherein decoding broadcast data comprises decoding one or more channels of broadcast data from one or more frames in the received broadcast signal.

5. A method according to claim 1, comprising the step of updating the broadcast service list using broadcast service data received at a different frequency during reception of a broadcast signal at an initial frequency.

6. A method according to claim 5, wherein step of updating the broadcast service list using broadcast service data received at a different frequency during reception of a broadcast signal at an initial frequency comprises:

receiving, demodulating and decoding a service information channel of a first frame in a broadcast signal at an initial frequency;

controlling the tuner to tune away from the initial frequency at which the broadcast signal is being received to a different frequency, the different frequency being one of the other frequencies in the spectrum awareness data;

receiving and demodulating a broadcast signal at the different frequency;

decoding a service information channel in a first frame of the received broadcast signal at the different frequency, the service information channel comprising broadcast service data defining available broadcast services for one or more frequencies;

updating the broadcast service list using the broadcast service data received at the different frequency; and controlling the tuner to tune back to the initial frequency and receiving, demodulating and decoding a service information channel from a second received frame in the broadcast signal at the initial frequency.

7. A method according to claim 6, wherein the first and second received frames are consecutive frames in the received broadcast signal.

8. A method according to claim 1, comprising the step of updating the spectrum awareness data during reception of a broadcast signal.

9. A method according to claim 8, wherein the step of updating the spectrum awareness data during reception of a broadcast signal comprises:

receiving, demodulating and decoding a first frame in a broadcast signal at an initial frequency;

controlling the tuner to tune away from the initial frequency at which the broadcast signal is being received to a different frequency, the different frequency being one of the other frequencies from the plurality of frequencies;

detecting a broadcast signal at the different frequency;

storing data corresponding with the detected broadcast signal at the different frequency to update the spectrum awareness data; and controlling the tuner to tune back to the initial frequency and receiving, demodulating and decoding a second frame of a broadcast signal at the initial frequency.

10. A method according to claim 9, wherein the first and second received frames are consecutive frames in the received broadcast signal.

11. A method according to claim 9, wherein the data being stored in the spectrum awareness data comprises at least data corresponding to a frequency at which a broadcast signal is detected.

12. A method according to claim 11, wherein the data being stored comprises a priority value associated with a detected broadcast signal, and the method comprises assigning a higher priority value to a detected broadcast signal not already stored in the spectrum awareness data than a broadcast signal already stored in the spectrum awareness data.

13. A method according to claim 12, comprising incrementally reducing the priority value associated with a detected broadcast signal after the respective data for the detected broadcast signal has been in the spectrum awareness data for a first period of time.

14. A method according to claim 12, comprising removing data associated with a detected broadcast signal from the spectrum awareness data when the priority value for the respective detected broadcast signal falls below a threshold priority value.

15. A method according to claim 9, wherein detecting a broadcast signal at the different frequency comprises determining the presence of a broadcast signal at the different frequency.

16. A method according to claim 15, wherein determining the presence of a broadcast signal comprises detecting a signal having a plurality of frames with substantially the same frame structure as a broadcast signal.

17. A method according to claim 15, wherein the broadcast signal comprises a plurality of symbols, each symbol comprising a guard frame comprising a cyclic prefix, and a data portion, the step of determining the presence of a broadcast signal comprising the steps of:

receiving a plurality of samples at the respective frequency, the number of samples corresponding with the length of at least two symbols;

performing a sliding correlation on the received plurality of samples to identify a peak of correlation between the samples, the sliding correlation occurring a number of samples apart corresponding with a number of samples in the data portion of a symbol;

correcting a phase of the received samples using the identified peak in correlation to generate a phase corrected signal;

performing a first correlation comprising correlating a plurality of samples from a first region of the phase corrected signal with a plurality of samples in a second region of the phase corrected signal;

performing a second correlation comprising correlating a plurality of samples from a third region of the phase corrected signal with a plurality of samples in a fourth region of the phase corrected signal; and detecting a broadcast signal in the plurality of samples from the broadcast receiver based on the first and second correlations.

18. A method according to claim 15, wherein determining the presence of a broadcast signal comprises determining the presence of a signal power indicating the presence of a broadcast signal at the respective frequency.

19. A method according to claim 9, wherein detecting a broadcast signal at the different frequency comprises determining a quality metric of the broadcast signal at the different frequency.

20. A method according to claim 1, comprising the step of generating the spectrum awareness data prior to controlling a tuner of a receiver to tune to a first frequency.

21. A method according to claim 20, wherein generating the spectrum awareness data comprises:

controlling the tuner to tune to each of the plurality of frequencies in turn;

at each of the plurality of frequencies, detecting a broadcast signal at the respective frequency; and storing data corresponding with the detected broadcast signal at the respective frequency to generate the spectrum awareness data.

22. A method according to claim 21, wherein the data being stored in the spectrum awareness data comprises at least data corresponding to a frequency at which a broadcast signal is detected.

23. A method according to claim 22, wherein the data being stored comprises a priority value associated with a detected broadcast signal, and the method comprises assigning a higher priority value to a detected broadcast signal not already stored in the spectrum awareness data than a broadcast signal already stored in the spectrum awareness data.

24. A method according to claim 23, comprising incrementally reducing the priority value associated with a detected broadcast signal after the respective data for the detected broadcast signal has been in the spectrum awareness data for a first period of time.

25. A method according to claim 23, comprising removing data associated with a detected broadcast signal from the spectrum awareness data when the priority value for the respective detected broadcast signal falls below a threshold priority value.

26. A method according to claim 21, wherein detecting a broadcast signal at the respective frequency comprises determining the presence of a broadcast signal at the respective frequency.

27. A method according to claim 26, wherein determining the presence of a broadcast signal comprises detecting a signal having a plurality of frames with substantially the same frame structure as a broadcast signal.

28. A method according to claim 26, wherein the broadcast signal comprises a plurality of symbols, each symbol comprising a guard frame comprising a cyclic prefix, and a data portion, the step of determining the presence of a broadcast signal comprising the steps of:

receiving a plurality of samples at the respective frequency, the number of samples corresponding with the length of at least two symbols;

performing a sliding correlation on the received plurality of samples to identify a peak of correlation between the samples, the sliding correlation occurring a number of samples apart corresponding with a number of samples in the data portion of a symbol;

correcting a phase of the received samples using the identified peak in correlation to generate a phase corrected signal;

performing a first correlation comprising correlating a plurality of samples from a first region of the phase corrected signal with a plurality of samples in a second region of the phase corrected signal;

performing a second correlation comprising correlating a plurality of samples from a third region of the phase corrected signal with a plurality of samples in a fourth region of the phase corrected signal; and detecting a broadcast signal in the plurality of samples from the broadcast receiver based on the first and second correlations.

29. A method according to claim 26, wherein determining the presence of a broadcast signal comprises determining the presence of a signal power indicating the presence of a broadcast signal at the respective frequency.

30. A method according to claim 21, wherein detecting a broadcast signal at the respective frequency comprises determining a quality metric of the broadcast signal.

31. A method according to claim 21, wherein the tuner is controlled to tune to each of the plurality of frequencies one or more times during generation of the spectrum awareness data.

32. A method according to claim 21, wherein the step of generating the spectrum awareness data is performed after the controller has decoded broadcast data corresponding with a service information channel in a first frame of a received broadcast signal at a frequency corresponding with a last frequency in the spectrum awareness data.

33. A method according to claim 1, wherein the received broadcast signal is a DAB signal, and the service information channel is a Fast Information Channel in the received DAB signal.

34. A digital radio receiver system for scanning for broadcast services in a broadcast signal to generate a broadcast service list for use in controlling the digital radio receiver system, the broadcast signal comprising a plurality of frames, each frame comprising a plurality of time-interleaved channels, each channel comprising broadcast data associated with one or more broadcast services, the broadcast service list comprising data defining available broadcast services for a digital radio receiver at one or more frequencies, the receiver system comprising:

a tuner coupleable to an antenna for receiving broadcast signals;

a demodulator coupled to an output of the tuner for demodulating a received broadcast signal into a plurality of received frames;

a decoder coupled to an output of the demodulator for decoding the received plurality of frames; and a controller coupled to the tuner and demodulator, wherein the controller is configured to:

control the tuner to tune to a first frequency;

receive a first broadcast signal at the first frequency;

demodulate the first received broadcast signal;

decode a broadcast data corresponding with a service information channel in a first frame of the first received broadcast signal, the service information channel comprising broadcast service data defining available broadcast services for one or more frequencies; and generate a broadcast service list using the broadcast service data received at the first frequency, wherein the controller is configured to select the first frequency from a plurality of frequencies at which a broadcast signal is receivable based on spectrum awareness data, the spectrum awareness data defining one or more frequencies at which a broadcast signal is receivable by the receiver, and wherein the one or more frequencies of the spectrum awareness data are a filtered subset of the plurality of frequencies.

35. A receiver system according to claim 34, wherein the controller is configured to:

control the tuner to tune to a second frequency;

receive a second broadcast signal at the second frequency;

demodulate the second received broadcast signal;

decode broadcast data corresponding with a service information channel in a first frame of the second received broadcast signal, the service information channel comprising broadcast service data defining available broadcast services for one or more frequencies; and update the broadcast service list using the broadcast service data received at the second frequency, wherein the second frequency is different from the first frequency, and wherein the controller selects the second frequency from the plurality of frequencies based on the spectrum awareness data.

36. A receiver system according to claim 34, wherein the service information channel comprises at least one channel in each frame.

37. A receiver system according to claim 34, wherein decoding broadcast data comprises decoding one or more channels of broadcast data from one or more frames in the received broadcast signal.

38. A receiver system according to claim 34, wherein the controller is configured to update the broadcast service list using broadcast service data received at a different frequency during reception of a broadcast signal at an initial frequency.

39. A receiver system according to claim 38, wherein the controller is configured to:

receive, demodulate and decode a service information channel of a first frame in a broadcast signal at an initial frequency;

control the tuner to tune away from the initial frequency at which the broadcast signal is being received to a different frequency, the different frequency being one of the other frequencies in the spectrum awareness data;

receive and demodulate a broadcast signal at the different frequency;

decode a service information channel in a first frame of the received broadcast signal at the different frequency, the service information channel comprising broadcast service data defining available broadcast services for one or more frequencies;

update the broadcast service list using the broadcast service data received at the different frequency; and control the tuner to tune back to the initial frequency and receive, demodulate and decode a service information channel from a second received frame in the broadcast signal at the initial frequency.

40. A receiver system according to claim 39, wherein the first and second received frames are consecutive frames in the received broadcast signal.

41. A receiver system according to claim 34, wherein the controller is configured to update the spectrum awareness data during reception of a broadcast signal.

42. A receiver systems according to claim 41, wherein the controller is configured to:

receive, demodulate and decode a first frame in a broadcast signal at an initial frequency;

control the tuner to tune away from the initial frequency at which the broadcast signal is being received to a different frequency, the different frequency being one of the other frequencies from the plurality of frequencies;

detect a broadcast signal at the different frequency;

store data corresponding with the detected broadcast signal at the different frequency to update the spectrum awareness data; and control the tuner to tune back to the initial frequency to receive, demodulate and decode a second frame of a broadcast signal at the initial frequency.

43. A receiver system according to claim 42, wherein the first and second received frames are consecutive frames in the received broadcast signal.

44. A receiver system according to claim 42, wherein the data being stored in the spectrum awareness data comprises at least data corresponding to a frequency at which a broadcast signal is detected.

45. A receiver system according to claim 44, wherein the data being stored comprises a priority value associated with a detected broadcast signal, and the controller is configured to assigning a higher priority value to a detected broadcast signal not already stored in the spectrum awareness data than a broadcast signal already stored in the spectrum awareness data.

46. A receiver system according to claim 45, wherein the controller is configured to incrementally reducing the priority value associated with a detected broadcast signal after the respective data for the detected broadcast signal has been in the spectrum awareness data for a first period of time.

47. A receiver system according to claim 45, wherein the controller is configured to remove data associated with a detected broadcast signal from the spectrum awareness data when the priority value for the respective detected broadcast signal falls below a threshold priority value.

48. A receiver system according to claim 42, wherein the controller is configured to detect a broadcast signal at the different frequency by determining the presence of a broadcast signal at the different frequency.

49. A receiver system according to claim 48, wherein determining the presence of a broadcast signal comprises detecting a signal having a plurality of frames with substantially the same frame structure as a broadcast signal.

50. A receiver system according to claim 48, wherein the broadcast signal comprises a plurality of symbols, each symbol comprising a guard frame comprising a cyclic prefix, and a data portion, and the controller is configured to determine the presence of a broadcast signal by:

receiving a plurality of samples at the respective frequency, the number of samples corresponding with the length of at least two symbols;

performing a sliding correlation on the received plurality of samples to identify a peak of correlation between the samples, the sliding correlation occurring a number of samples apart corresponding with a number of samples in the data portion of a symbol;

correcting a phase of the received samples using the identified peak in correlation to generate a phase corrected signal;

performing a first correlation comprising correlating a plurality of samples from a first region of the phase corrected signal with a plurality of samples in a second region of the phase corrected signal;

performing a second correlation comprising correlating a plurality of samples from a third region of the phase corrected signal with a plurality of samples in a fourth region of the phase corrected signal; and detecting a broadcast signal in the plurality of samples from the broadcast receiver based on the first and second correlations.

51. A receiver system according to claim 48, wherein determining the presence of a broadcast signal comprises determining the presence of a signal power indicating the presence of a broadcast signal at the respective frequency.

52. A receiver system according to claim 42, wherein detecting a broadcast signal at the different frequency comprises determining a quality metric of the broadcast signal at the different frequency.

53. A receiver system according to claim 52, wherein detecting a broadcast signal at the respective frequency comprises determining a quality metric of the broadcast signal.

54. A receiver system according to claim 34, wherein the controller is configured to generate the spectrum awareness data prior to controlling the tuner to tune to a first frequency.

55. A receiver system according to claim 54, wherein the controller is configured to generate the spectrum awareness data by:

controlling the tuner to tune to each of the plurality of frequencies in turn;

at each of the plurality of frequencies, detecting a broadcast signal at the respective frequency; and storing data corresponding with the detected broadcast signal at the respective frequency to generate the spectrum awareness data.

56. A receiver system according to claim 55, wherein the data being stored in the spectrum awareness data comprises at least data corresponding to a frequency at which a broadcast signal is detected.

57. A receiver system according to claim 56, wherein the data being stored comprises a priority value associated with a detected broadcast signal, and wherein the controller is configured to assign a higher priority value to a detected broadcast signal not already stored in the spectrum awareness data than a broadcast signal already stored in the spectrum awareness data.

58. A receiver system according to claim 57, wherein the controller is configured to incrementally reduce the priority value associated with a detected broadcast signal after the respective data for the detected broadcast signal has been in the spectrum awareness data for a first period of time.

59. A receiver system according to claim 57, wherein the controller is configured to remove data associated with a detected broadcast signal from the spectrum awareness data when the priority value for the respective detected broadcast signal falls below a threshold priority value.

60. A receiver system according to claim 55, wherein detecting a broadcast signal at the respective frequency comprises determining the presence of a broadcast signal at the respective frequency.

61. A receiver system according to claim 60, wherein determining the presence of a broadcast signal comprises detecting a signal having a plurality of frames with substantially the same frame structure as a broadcast signal.

62. A receiver system according to claim 60, wherein the broadcast signal comprises a plurality of symbols, each symbol comprising a guard frame comprising a cyclic prefix, and a data portion, the controller being configured to determine the presence of a broadcast signal by:

receiving a plurality of samples at the respective frequency, the number of samples corresponding with the length of at least two symbols;

performing a sliding correlation on the received plurality of samples to identify a peak of correlation between the samples, the sliding correlation occurring a number of samples apart corresponding with a number of samples in the data portion of a symbol;

correcting a phase of the received samples using the identified peak in correlation to generate a phase corrected signal;

performing a first correlation comprising correlating a plurality of samples from a first region of the phase corrected signal with a plurality of samples in a second region of the phase corrected signal;

performing a second correlation comprising correlating a plurality of samples from a third region of the phase corrected signal with a plurality of samples in a fourth region of the phase corrected signal; and detecting a broadcast signal in the plurality of samples from the broadcast receiver based on the first and second correlations.

63. A receiver system according to claim 60, wherein determining the presence of a broadcast signal comprises determining the presence of a signal power indicating the presence of a broadcast signal at the respective frequency.

64. A receiver system according to claim 55, wherein the controller is configured to control the tuner to tune to each of the plurality of frequencies one or more times during generation of the spectrum awareness data.

65. A receiver system according to claim 55, wherein the controller is configured to generate the spectrum awareness data after the controller has decoded a channel of broadcast data corresponding with a service information channel in a first frame of a received broadcast signal at a frequency corresponding with a last frequency in the spectrum awareness data.

66. A digital radio receiver system according to claim 34, wherein the received broadcast signal is a DAB signal, and the service information channel is a Fast Information Channel in the received DAB signal.

* * * * *